United States Patent
Zhu et al.

(10) Patent No.: US 9,547,245 B2
(45) Date of Patent: Jan. 17, 2017

(54) DUAL WAFER STAGE SWITCHING SYSTEM FOR A LITHOGRAPHY MACHINE

(75) Inventors: Yu Zhu, Beijing (CN); Yaying Chen, Beijing (CN); Ming Zhang, Beijing (CN); Dengfeng Xu, Beijing (CN); Jinsong Wang, Beijing (CN)

(73) Assignee: TSINGHUA UNIVERSITY (CN)

(*) Notice: Subject to any disclaimer, the term of this patent is extended or adjusted under 35 U.S.C. 154(b) by 190 days.

(21) Appl. No.: 14/009,289

(22) PCT Filed: Mar. 23, 2012

(86) PCT No.: PCT/CN2012/072974
§ 371 (c)(1),
(2), (4) Date: Nov. 26, 2013

(87) PCT Pub. No.: WO2012/130108
PCT Pub. Date: Oct. 4, 2012

(65) Prior Publication Data
US 2014/0071422 A1    Mar. 13, 2014

(30) Foreign Application Priority Data
Apr. 1, 2011    (CN) .......................... 2011 1 0082729

(51) Int. Cl.
*G03B 27/58*    (2006.01)
*G03F 7/20*    (2006.01)

(52) U.S. Cl.
CPC ....... *G03F 7/70725* (2013.01); *G03F 7/70733* (2013.01)

(58) Field of Classification Search
CPC .......................... G03F 7/70725; G03F 7/70733
(Continued)

(56) References Cited

U.S. PATENT DOCUMENTS 5,969,441 A    10/1999 Loopstra et al.
6,341,007 B1 *    1/2002 Nishi et al. .................... 355/53
(Continued)

FOREIGN PATENT DOCUMENTS

CN    101071275 A    11/2007
CN    201364459 Y    12/2009
(Continued)

OTHER PUBLICATIONS

International Search Report mailed on Jun. 28, 2012 for PCT/CN2012/072974.
(Continued)

*Primary Examiner* — Peter B Kim
(74) *Attorney, Agent, or Firm* — Hauptman Ham, LLP

(57) ABSTRACT

Disclosed is a dual wafer stage switching system for a lithography machine. The system comprises a base stage (30), a wafer stage (16.1) running at a pre-processing workstation, and a wafer stage (16.2) running at an exposure workstation. A rotating motor (41) is mounted under the base stage (30) for rotating the two wafer stages after the wafer stages have completed pre-processing and exposure operations in order to complete position switch of the wafer stages, wherein the base stage (30) is kept stationary during the switch. The present invention avoids rotation of a large inertia base stage and has low requirement for motor power, while eliminating a guide rail docking device and an auxiliary device and greatly simplifying system configuration. The system is easy and convenient to operate and easy to control.

5 Claims, 3 Drawing Sheets

(58) Field of Classification Search
USPC .......................................................... 355/72
See application file for complete search history.

(56) References Cited

U.S. PATENT DOCUMENTS

2003/0020889 A1*  1/2003  Takahashi ....................... 355/53
2010/0128241 A1*  5/2010  Kruizinga et al. .............. 355/72

FOREIGN PATENT DOCUMENTS

| CN | 101813890 A | 8/2010 |
| CN | 102141739 A | 8/2011 |
| JP | 09270383 A | 10/1997 |

OTHER PUBLICATIONS

Notification of Grant Patent Application for Application No. 201110082729.4 dated Nov. 6, 2012.
Notification of 1st Office Action for Application No. 201110082729.4 dated Jan. 30, 2012.
Notification of 2nd Office Action for Application No. 201110082729.4 dated Jun. 26, 2012.

* cited by examiner

DUAL WAFER STAGE SWITCHING SYSTEM FOR A LITHOGRAPHY MACHINE

CROSS REFERENCE TO RELATED APPLICATION

This application claims the priority of Chinese Patent Application No. 201110082729.4, filed on Apr. 1, 2011 in the Chinese Patent and Trade Mark Office. Further, this application is the National Phase application of International Application No. PCT/CN2012/072974, filed on Mar. 23, 2012 which is incorporated herein by reference in its entirety.

TECHNICAL FIELD OF THE INVENTION

The present invention relates to a lithography machine comprising two stages for holding wafers, and particularly to a lithography machine provided with a rotary switching bridge. The present invention belongs to the field of the semiconductor equipment.

BACKGROUND OF THE INVENTION

In manufacturing process of an integrated circuit (IC) chip, it is one of the most important processes to expose and transfer a design pattern of a chip onto a photoresist on the wafer surface, which is performed with an apparatus called lithography machine (exposure machine). The resolution and exposure efficiency of the lithography machine has a significant impact on the characteristic line width (i.e., the resolution) and production rate of the IC chip. And, as a critical system of the lithography machine, the motion precision and process rate of the wafer ultra-precision motion positioning system (hereinafter abbreviated as wafer stage), can largely determine the resolution and exposure efficiency of the lithography machine.

FIG. 1 illustrates the main principle of a step-and-scan projection lithography machine. Deep ultra-violet light from a light source 45 transmits through a mask 47 and lens 49 and projects a certain portion of the pattern of the mask onto a specific chip of the wafer 50, wherein the motions of the mask and the wafer are in opposite directions and are synchronized according to a specific speed ratio, and finally, the whole pattern on the mask is transferred onto the corresponding chip of the wafer.

The main function of the wafer stage motion positioning system is to move, with the wafer held thereon, in the exposure process at a preset speed and in a preset direction in order to allow precise transfer of the mask pattern onto various parts of the wafer. Due to the small line width of the chip (presently, the minimum line width has reached 45 nm), in order to guarantee the precision and resolution of the lithography, the wafer stage is required to have a very high moving and positioning accuracy; since the productivity of the lithography is determined largely by the motion speed of the wafer stage, for improvement of productivity, there is an increasing demand for improving the motion speed of the wafer stage.

FIG. 2 is a structural schematic diagram of a wafer support platform of a lithography machine in the related art. The wafer support platform 16 includes a coarse motion module 18 and a fine motion module 20. Each of the coarse motion module 18 and the fine motion module 20 has a stationary part, a movable part and a driving part. A stationary part 8 of the coarse motion module 18 is connected to a base stage 30. The movable part of the coarse motion module 18 is movable relative to the stationary part. A stationary part 12 of the fine motion module 20 is connected to the movable part 10 of the coarse motion module 18. A movable part 14 of the fine motion module 20 is movable relative to the stationary part 12. The wafer support platform 16 is configured to support a wafer W, and the wafer W is not a part of the wafer support platform. Herein, the "stationary part" is a concept defined with respect to the movable part, and the "stationary part" itself can also be movable. It is well known that the driving motor for the coarse motion module may be a linear motor, etc., and the driving motor for the fine motion module may be a planar motor, a voice coil motor, etc.

SUMMARY OF THE INVENTION

Technical Problem

For a conventional wafer stage such as that described in Patent EP 0729073 and U.S. Pat. No. 5,996,437, the lithography machine has only one wafer moving and positioning unit, i.e., it has only one wafer stage, on which such preparatory operations as leveling and focusing would all be performed. These operations are time-consuming, especially aligning process, in which low speed scanning with very high precision (typical alignment scanning speed is 1 mm/s) is required and further time-saving is difficult. Thus, in order to improve the production rate of the lithography machine, it is necessary to continuously increase the motion speed of stepping and exposure scanning of the wafer stage, however, the increase of the speed inevitably leads to a compromise of system dynamic performance, and a large number of technical measures are required to guarantee and improve the motion precision of the wafer stage, and in order to keep the existing precision or achieve a higher degree, cost to be paid is greatly increased.

The structure described in Patent WO98/40791 (Publication date: Sep. 17, 1998; Country: The Netherlands) adopts a dual wafer stage structure, and such preparatory operations as wafer attachment and detachment, pre-alignment and alignment are transferred onto a second wafer stage which moves separately and in synchronization with the exposure wafer stage. Without increase of the motion speed of the wafer stage, a lot of preparatory operations, that otherwise would be performed on the exposure wafer stage, are now performed on the second wafer stage, thereby greatly reducing the dwelling time of each wafer on the exposure wafer stage, and the production rate is significantly improved. However, unfortunately, the system has a main drawback of non-centroid driving of the wafer stage system.

In the patent "Dual wafer stage switching device for a lithography machine" (Publication number: CN 201364459) filed in 2009 by the same applicant of the present application, we disclose a dual wafer stage switching system for a lithography machine, which has advantages of simple configuration, high utilization for space and elimination of the need for a auxiliary docking device, etc. However, this dual wafer stage system also has its own drawbacks. A rotating motor is mounted under the base stage, resulting in a complicated structure. And when switching, the whole base stage is rotated. Because mounted on the base stage are an X-direction linear motor, a Y-direction linear motor, and a coarse motion stage, a fine motion stage etc., the rotational inertia becomes large and the motor power is required to be high, and precise control and positioning become not so easy, and it is also susceptible to interference of auxiliary devices such as cables.

Technical Solution

In order to address these drawbacks mentioned above in the related art, an object of the present invention is to provide a dual wafer stage switching system for a lithography machine provided with a rotary switching bridge to overcome disadvantages such as non-centroid driving, complicated configuration, need for high precision of guide rail docking, large rotary inertia, etc., that are existing in an existing dual wafer stage switching system. And advantages can be achieved, such as simple configuration, high utilization for space, low requirement for motor power, small rotational inertia, no need for a guide rail docking device, etc., and finally, the exposure efficiency of the lithography machine is improved.

The technical solution of the present invention is a dual wafer stage switching system for a lithography machine, the system comprises a wafer stage operating at an exposure workstation and a wafer stage operating at a pre-processing workstation, the two wafer stages are provided on a same base stage, wherein a rotating motor is mounted under the base stage, and after the wafer stage operating at the exposure workstation and the wafer stage operating at the pre-processing workstation have completed exposure and pre-processing operations respectively, the rotating motor drives the two wafer stages on the base stage to rotate by 180° counterclockwise synchronously, thus enabling position switching of the two wafer stages. During the process of switching, the base stage is kept stationary.

Two tracks of linear motor stator magnetic steel are disposed in the X-direction along the edges of the two long sides of the base stage, a first linear motor stator magnetic steel is shared by a first Single-Degree-Of-Freedom (SDOF) driving unit and a second SDOF driving unit which are moving in the X-direction; a second linear motor stator magnetic steel is shared by a third SDOF driving unit and a fourth SDOF driving unit which are moving in the X-direction; a first Y-direction guide rail is coupled respectively with the first SDOF driving unit and the third SDOF driving unit which are moving in the X-direction, to drive jointly the first wafer stage's motion in the X-Y plane; the second Y-direction guide rail is coupled respectively with the second SDOF driving unit and the fourth SDOF driving unit which are moving in the X-direction, to drive jointly the second wafer stage's motion in the X-Y plane; around the base stage are respectively disposed dual frequency laser interferometers for measuring the displacement in the X-direction and dual frequency laser interferometers for measuring the displacement in the Y-direction.

The present invention also includes other additional technical features, wherein the output shaft of the rotating motor passes through the base stage, one end of the output shaft is connected with a switching bridge, the switching bridge comprising a switching bridge body with two locking devices disposed respectively at the two sides of the switching bridge body, the two locking devices corresponding to the movable parts of the fine motion stages of the dual wafer support platform.

Another technical feature of the present invention is that, the locking devices are able to protrude and retract with respect to the switching bridge body.

Advantageous Effect

In comparison with the prior art, the invention has the following prominent advantages: the system has a rotating motor mounted under the base stage, the rotating motor only drives the movable parts of the fine motion stages and the wafer stages to rotate to perform position switching of the two wafer stages and at the same time the base stage doesn't rotate at all. The invention avoids large rotational inertia and high requirement for motor power, while eliminating a guide rail docking device and the like and greatly simplifying system configuration, and the switching is easy and convenient to control and operate.

Figure 1:
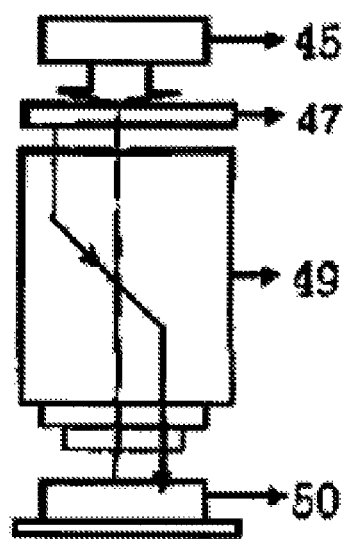
FIG. 1 is a schematic diagram of the working principle of a lithography machine.

In the drawings, 2—pre-processing workstation; 3—exposure workstation; 9.1—first linear motor stator magnetic steel; 9.2—second linear motor stator magnetic steel; 4—first SDOF driving unit; 5—second SDOF driving unit; 6—third SDOF driving unit; 7—fourth SDOF driving unit; 11.1—first dual frequency laser interferometer for measuring X-direction displacement; 11.2—second dual frequency laser interferometer for measuring X-direction displacement; 8—stationary part of coarse motion module; 10—movable part of coarse motion module; 12—stationary part of fine motion module; 14—movable part of fine motion module; 16—wafer support platform; 16.1—first wafer stage; 16.2—second wafer stage; 18—coarse motion module; 20—fine motion module; 13.1—first dual frequency laser interferometer for measuring Y-direction displacement; 13.2—second dual frequency laser interferometer for measuring Y-direction displacement; 15.1—first Y-direction guide rail; 15.2—second Y-direction guide rail; 30—base stage; 40—switching bridge body; 41—rotating motor; 42—output shaft of rotating motor; 43.1—first locking device; 43.2—second locking device; 45—light source; 47—mask; 49—lens system; and, 50—wafer.

DETAILED DESCRIPTION OF EMBODIMENTS OF THE INVENTION

The dual wafer stage switching system for a lithography machine of the present invention will be described with details in conjunction with the drawings below.

Figure 2:
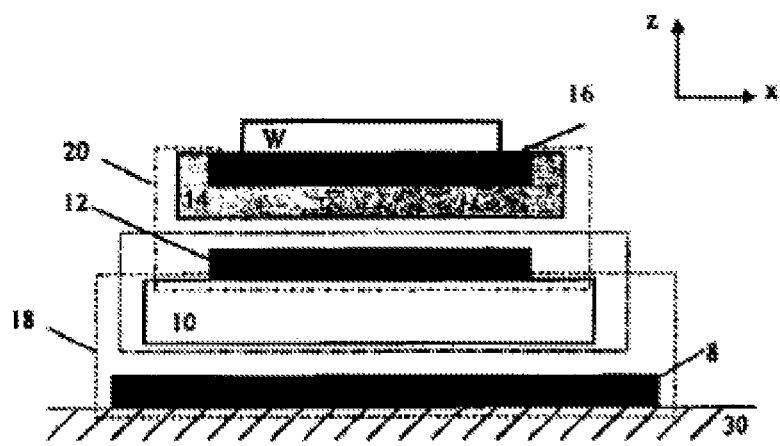
FIG. 2 is a structural schematic diagram of a wafer support platform of a lithography machine in the related art.

FIG. 2 is structural schematic diagram of a wafer support platform 16. The wafer support platform 16 comprises a coarse motion module 18 and a fine motion module 20. Each of the coarse motion module 18 and the fine motion module 20 has a stationary part, a movable part and a driving part. A stationary part 8 of the coarse motion module 18 is connected to a base stage 30. The movable part of the coarse motion module 18 is movable relative to the stationary part. A stationary part 12 of the fine motion module 20 is connected to the movable part 10 of the coarse motion module 18. The movable part 14 of the fine motion module 20 is movable relative to the stationary part 12.

Figure 3:
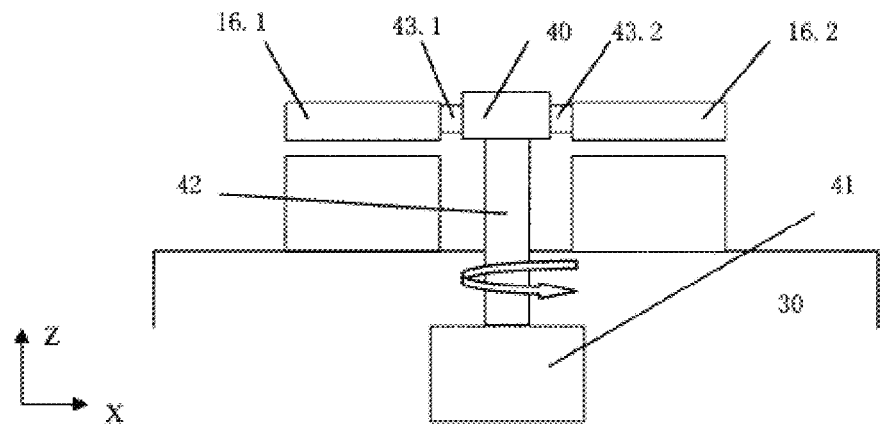
FIG. 3 is a structural schematic diagram of a dual wafer stage switching system for a lithography machine provided by the present invention.

FIG. 3 shows a structural schematic diagram of dual wafer stage switching of the present invention. Each of a first wafer stage 16.1 and a second wafer stage 16.2 comprises a movable part 14 of a fine motion stage 20 (corresponds to the upper rectangle in FIG. 3) and a stationary part 12 of the fine motion module 20 and a coarse motion module 18 (corresponds to the lower rectangle in FIG. 3). The stationary parts of the coarse motion stages of the dual wafer support platform are connected with the base stage 30, respectively. A rotating motor 41 is mounted under the base stage 30. An output shaft 42 of the rotating motor 41 passes through the base stage 30. An end of the output shaft of the rotating motor is connected to a switching bridge which comprises a switching bridge body 40, on the two sides of which are arranged a first locking device 43.1 and a second locking device 43.2, respectively. And the two locking devices correspond to the movable parts 14 of the fine motion stages of the dual wafer support platform, respectively. At the time of switching, the dual wafer support platform move to the two sides of the switching bridge, the two locking devices lock the movable parts of the fine motion stages of the dual wafer support platform, respectively, the rotating motor 41 drives the rotating shaft 42 of the rotating motor, the switching bridge and the two movable parts of the first wafer stage 16.1 and the second wafer stage 16.2 to rotate counterclockwise by 180° precisely, and after precise positioning, the first locking device 43.1 and the second locking device 43.2 unlock to complete the switching, while the other parts of the wafer support platform such as the stationary parts of the coarse motion stage and the fine motion stage as well as the base stage 30 are kept stationary. Therein, the first locking device 43.1 and the second locking device 43.2 are able to protrude and retract with respect to the switching bridge body 40 so as to avoid interference with the wafer support platform and save space. The locking devices include, e.g., well known vacuum adhesion bearings.

Figure 4:
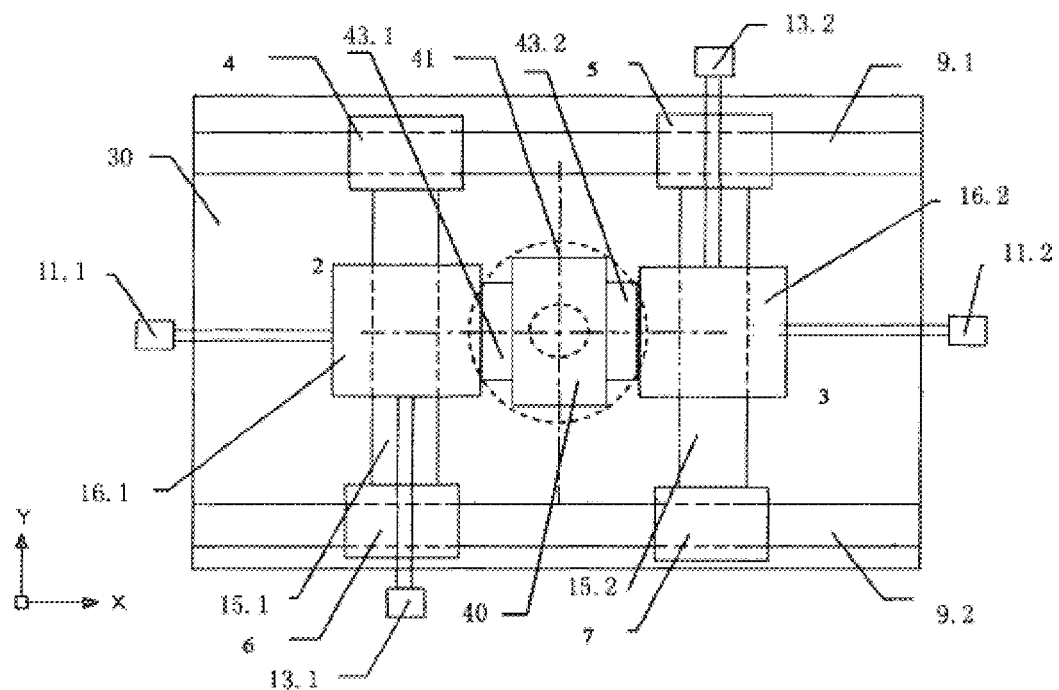
FIG. 4 is a top view of a lithography machine provided by the present invention before the switching of dual wafer stage.

FIG. 4 shows a top view of a lithography machine of the present invention before the switching of dual wafer stage, which including the base stage 30, a pre-processing workstation 2, and an exposure workstation 3. The first wafer stage 16.1 operates at the pre-processing workstation 2, and the second wafer stage 16.2 operates at the exposure workstation 3. Two tracks of linear motor stator magnetic steel, i.e., a first linear motor stator magnetic steel 9.1 and a second linear motor stator magnetic steel 9.2, are disposed in the X-direction along the edges of the two long sides of the base stage 30, and the first linear motor stator magnetic steel 9.1 is shared by a first Single-Degree-Of-Freedom (SDOF) driving unit 4 and a second SDOF driving unit 5 which are moving in the X-direction, and similarly, the second linear motor stator magnetic steel 9.2 is shared by a third SDOF driving unit 6 and a fourth SDOF driving unit 7 which are moving in the X-direction; a first Y-direction guide rail 15.1 passes through the wafer support platform and drives the first wafer stage 16.1's motion in the Y-direction; and the first Y-direction guide rail 15.1 is coupled with the first SDOF driving unit 4 and the third SDOF driving unit 6 which are moving in the X-direction, respectively, to drive jointly the first wafer stage 16.1's motion in the X-Y plane; similarly, a second Y-direction guide rail 15.2 passes through the other wafer support platform to drive the second wafer stage 16.2's motion in the Y-direction, and the second Y-direction guide rail 15.2 is coupled with the second SDOF driving unit 5 and the fourth SDOF driving unit 7 which are moving in the X-direction, to drive jointly the second wafer stage 16.2's motion in the X-Y plane; around the base stage 30 are disposed respectively first and second dual frequency laser interferometers 11.1 and 11.2 for measuring the displacement in the X-direction and first and second dual frequency laser interferometers 13.1 and 13.2 for measuring the displacement in the Y-direction.

The wafer support platform has a vacuum preloaded air bearing installed at the bottom thereof. The upper surface of the base stage 30 is a guide surface. A Y-direction guide rail passes through the interior of the wafer support platform, and has a linear motor stator magnetic steel installed thereon. A coil as the rotor of the linear motor is installed on the wafer support platform. Closed preloaded air bearings are installed on the two inside vertical side surfaces of the wafer support platform to confine the relative motion along the Y-direction between the Y-direction guide rail and the wafer stage.

Each of the SDOF driving units has a linear motor coil rotor and a vacuum preloaded air bearing installed at the bottom thereof, and the first linear motor stator magnetic steel 9.1 and the second linear motor stator magnetic steel 9.2 are installed on the two long sides of the base stage 30. The first SDOF driving unit 4 and the third SDOF driving unit 6 are coupled with the first Y-direction guide rail 15.1, to drive the first wafer stage 16.1's motion in the X-Y plane. The second SDOF driving unit 5 and the fourth SDOF driving unit 7 are coupled with the second Y-direction guide rail 15.2, to drive the second wafer stage 16.2's motion in the X-Y plane.

Figure 5:
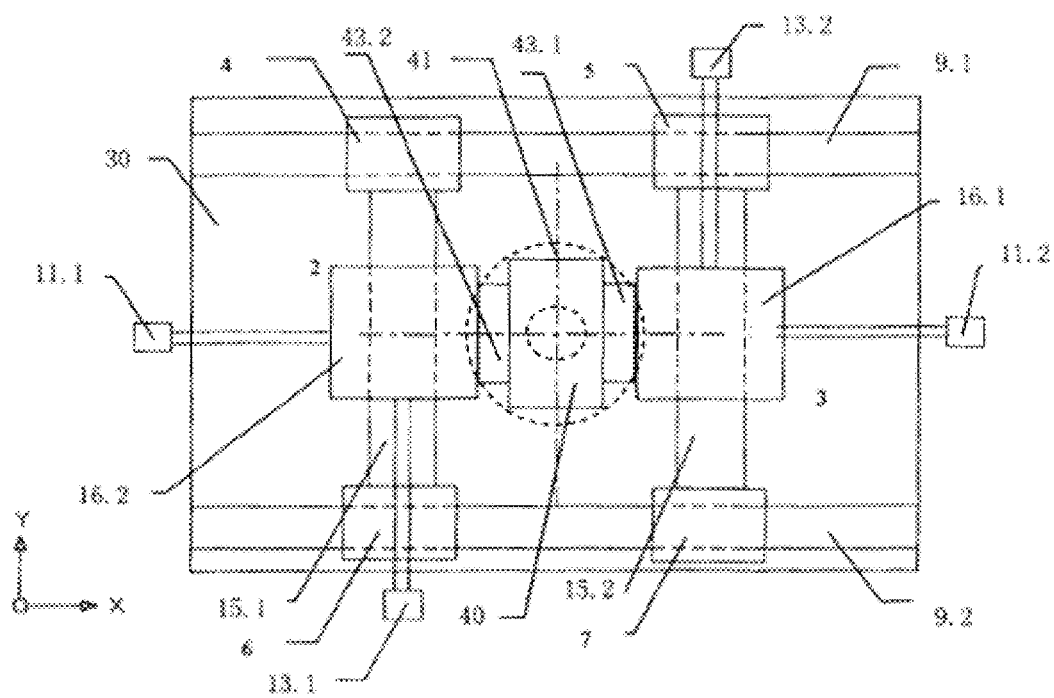
FIG. 5 is a top view of a lithography machine provided by the present invention after the switching of dual wafer stage.

FIG. 5 shows a top view after the switching of dual wafer stage for a lithography machine of the present invention. After the switching, the second wafer stage 16.2 originally located at the exposure workstation 3 is transferred to the pre-processing workstation 2 along with the movable part of the fine motion stage to perform processing such as wafer detachment; and the first wafer stage 16.1 originally located at the pre-processing workstation 2 is transferred to the exposure workstation 2 along with the movable part of the fine motion stage to perform exposure processing. At the time of switching, the other parts such as the coarse motion stage, the base stage, the stationary parts of the fine motion stage and the measuring device, etc. are kept all stationary.

The invention claimed is:

1. A dual wafer stage switching system for a lithography machine, the dual wafer stage switching system comprises:
   a first wafer stage (16.1) operating at a pre-processing workstation (2);
   a second wafer stage (16.2) operating at an exposure workstation (3), the two wafer stages are provided on a same base stage (30), wherein
      each of the first wafer stage (16.1) and the second wafer stage (16.2) comprises:
         a coarse motion module (18) connected to the base stage (30), and
         a fine motion module (20) on the coarse motion module (18), the fine motion module (20) comprises:
            a movable part (14), and
            a stationary part (12) under the movable part (14), and
   wherein a rotating motor (41) is mounted under the base stage (30); after the second wafer stage (16.2) operating at the exposure workstation (3) and the first wafer stage (16.1) operating at the pre-processing workstation (2) have completed exposure and pre-processing operations respectively, the rotating motor (41) drives the movable parts (14) to rotate by 180° counterclockwise synchronously, and during the process of switching, the base stage (30), the coarse motion modules (18) and the stationary parts (12) are kept stationary.

2. The dual wafer stage switching system for a lithography machine according to claim 1, wherein two tracks of linear motor stator magnetic steel (9.1, 9.2) are disposed in the X-direction along the edges of two long sides of the base stage (30), a first linear motor stator magnetic steel (9.1) is shared by a first Single-Degree-Of-Freedom (SDOF) driving unit (4) and a second SDOF driving unit (5) which move in the X-direction; a second linear motor stator magnetic steel (9.2) is shared by a third SDOF driving unit (6) and a fourth SDOF driving unit (7) which move in the X-direction; a first Y-direction guide rail (15.1) is coupled with the first SDOF driving unit (4) and the third SDOF driving unit (6) which move in the X-direction, to drive jointly the movable part (14) of the first wafer stage (16.1)'s motion in the X-Y plane; a second Y-direction guide rail (15.2) is coupled with the second SDOF driving unit (5) and the fourth SDOF driving unit (7) which move in the X-direction, to drive jointly the movable part (14) of the second wafer stage (16.2)'s motion in the X-Y plane; around the base stage (30) are disposed dual frequency laser interferometers (11.1, 11.2) for measuring the displacement in the X-direction and dual frequency laser interferometers (13.1, 13.2) for measuring the displacement in the Y-direction.

3. The dual wafer stage switching system for a lithography machine according to claim 1, wherein an output shaft (42) of the rotating motor (41) passes through the base stage (30), an end of the output shaft (42) is connected to a switching bridge which comprises a switching bridge body (40), on each of two sides of the switching bridge body (40) is arranged a locking device (43.1, 43.2) respectively, and the two locking devices corresponding to the movable parts (14) respectively.

4. The dual wafer stage switching system for a lithography machine according to claim 3, wherein the two locking devices (43.1, 43.2) protrude and retract with respect to the switching bridge body (40).

5. The dual wafer stage switching system for a lithography machine according to claim 4, wherein the locking devices (43.1, 43.2) are connected to the wafer stages (16.1, 16.2).

* * * * *